United States Patent
Chau et al.

(10) Patent No.: US 7,166,505 B2
(45) Date of Patent: *Jan. 23, 2007

(54) METHOD FOR MAKING A SEMICONDUCTOR DEVICE HAVING A HIGH-K GATE DIELECTRIC

(75) Inventors: Robert Chau, Beaverton, OR (US); Reza Arghavani, Aloha, OR (US); Mark Doczy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/943,661

(22) Filed: Sep. 16, 2004

(65) Prior Publication Data

US 2005/0032318 A1 Feb. 10, 2005

Related U.S. Application Data

(60) Division of application No. 10/618,226, filed on Jul. 11, 2003, now abandoned, which is a continuation of application No. 10/082,530, filed on Feb. 22, 2002, now Pat. No. 6,617,209.

(51) Int. Cl.
*H01L 21/8242* (2006.01)
*H01L 21/8232* (2006.01)
*H01L 21/335* (2006.01)

(52) U.S. Cl. ............... 438/240; 438/143; 438/151; 438/197; 438/308; 438/471; 438/472; 438/473; 438/474; 438/475; 438/477; 438/591; 438/783; 438/785; 438/795; 438/906; 438/974; 438/216; 438/261; 438/287; 438/585; 257/E21.154

(58) Field of Classification Search ............... 438/240, 438/143, 151, 197, 308, 471–477, 591, 783–785, 438/216, 795, 906, 974, 261, 287, 585, 976
See application file for complete search history.

(56) References Cited

U.S. PATENT DOCUMENTS

| | | | |
|---|---|---|---|
| 5,625,217 A | 4/1997 | Chau et al. |
| 5,753,560 A | 5/1998 | Hong et al. |
| 5,783,478 A | 7/1998 | Chau et al. |
| 5,891,798 A | 4/1999 | Doyle et al. |
| 6,020,024 A | 2/2000 | Maiti et al. |

(Continued)

FOREIGN PATENT DOCUMENTS

EP    1 124 262 A    8/2001

OTHER PUBLICATIONS

Douglas Barlage et al., "High-Frequency Response of 100nm Integrated CMOS Transistor with High-K Gate Dielectric", IEEE 2001.

(Continued)

*Primary Examiner*—Michael Lebentritt
*Assistant Examiner*—Mohsen Ahmadi
(74) *Attorney, Agent, or Firm*—Laleh Jalali

(57) ABSTRACT

A method for making a semiconductor device is described. That method includes forming on a substrate a dielectric layer that has a dielectric constant that is greater than the dielectric constant of silicon dioxide. The dielectric layer is modified so that it will be compatible with a gate electrode to be formed on the dielectric layer, and then a gate electrode is formed on the dielectric layer.

11 Claims, 1 Drawing Sheet

U.S. PATENT DOCUMENTS

| | | | |
|---|---|---|---|
| 6,063,698 A | 5/2000 | Tseng et al. | |
| 6,087,261 A | 7/2000 | Nishikawa et al. | |
| 6,121,094 A | 9/2000 | Gardner et al. | |
| 6,184,072 B1 | 2/2001 | Kaushik et al. | |
| 6,235,594 B1 | 5/2001 | Merchant et al. | |
| 6,297,539 B1 | 10/2001 | Ma et al. | |
| 6,306,742 B1 | 10/2001 | Doyle et al. | |
| 6,365,450 B1 * | 4/2002 | Kim | 438/216 |
| 6,365,467 B1 | 4/2002 | Joo | |
| 6,391,802 B1 | 5/2002 | Delpech et al. | |
| 6,410,376 B1 | 6/2002 | Ng et al. | |
| 6,420,279 B1 | 7/2002 | Ono et al. | |
| 6,436,777 B1 | 8/2002 | Ota | |
| 6,475,874 B2 | 11/2002 | Xiang et al. | |
| 6,514,828 B2 | 2/2003 | Ahn et al. | |
| 6,544,906 B2 * | 4/2003 | Rotondaro et al. | 438/785 |
| 6,586,288 B2 | 7/2003 | Kim et al. | |
| 6,617,209 B1 | 9/2003 | Chau et al. | |
| 6,617,210 B1 | 9/2003 | Chau et al. | |
| 6,642,131 B2 | 11/2003 | Harada | 438/591 |
| 6,667,246 B2 | 12/2003 | Mitsuhashi et al. | 438/756 |
| 2002/0058374 A1 | 5/2002 | Kim et al. | |
| 2002/0081826 A1 * | 6/2002 | Rotondaro et al. | 438/585 |
| 2002/0102797 A1 | 8/2002 | Muller et al. | |
| 2002/0137317 A1 | 9/2002 | Kaushik et al. | |
| 2002/0197790 A1 | 12/2002 | Kizilyalli et al. | |
| 2003/0032303 A1 | 2/2003 | Yu et al. | |
| 2003/0045080 A1 | 3/2003 | Visokay et al. | |

OTHER PUBLICATIONS

Robert Chau et al., A 50nm Depleted-Substrate CMOS Transistor (DST), IEEE 2001.

Polishchuk et al., "Dual Workfunction CMOS Gate Technology Based on Metal Interdiffusion" www.eesc.berkeley.edu, 1 pg.

Smith R.C., et al. "Chemical Vapor Deposition of the Oxides of Titantium, Zirconium and Hafnium for Use as High-K Materials in Microelectronic Devices. A Carbon-Free Precursor for the Synthesis of Hafnium Oxide", Advance Materials for Optics and Electronics vol. 10, 2000, pp. 105-114.

International Search Report PCT/US 03/35955.

* cited by examiner

METHOD FOR MAKING A SEMICONDUCTOR DEVICE HAVING A HIGH-K GATE DIELECTRIC

This is a Divisional application of Ser. No.: 10/618,226 filed Jul. 11, 2003, which is now abandoned, and which is a Continuation application of Ser. No.: 10/082,530 tiled Feb. 22, 2002, now U.S. Pat. No. 6,617,209.

FIELD OF THE INVENTION

The present invention relates to methods for making semiconductor devices, in particular, semiconductor devices that include high-k gate dielectric layers.

BACKGROUND OF THE INVENTION

MOS field-effect transistors with very thin gate dielectrics made from silicon dioxide may experience unacceptable gate leakage currents. Forming the gate dielectric from certain high-k dielectric materials, in place of silicon dioxide, can reduce gate leakage. Such a dielectric may not, however, be compatible with polysilicon—the preferred material for making the device's gate electrode. Placing a thin layer of titanium nitride, which is compatible with many high-k gate dielectrics, between a high-k gate dielectric and a polysilicon-based gate electrode may enable such a dielectric to be used with such a gate electrode. Unfortunately, the presence of such a layer may increase the transistor's threshold voltage, which is undesirable.

Accordingly, there is a need for an improved process for making a semiconductor device that includes a high-k gate dielectric. There is a need for such a process in which a polysilicon-based gate electrode is formed on such a gate dielectric to create a functional device—without causing undesirable work function shifts. The method of the present invention provides such a process.

DETAILED DESCRIPTION OF THE PRESENT INVENTION

Figure 1A:
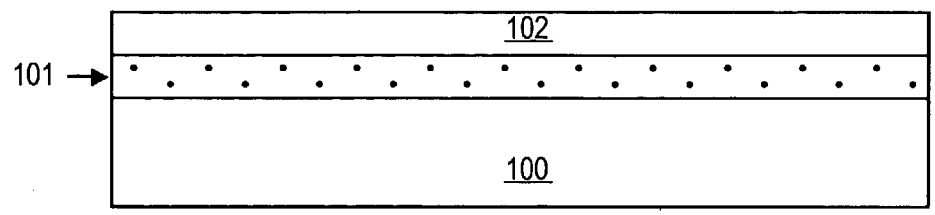
FIGS. 1a–1d represent cross-sections of structures that may be formed when carrying out an embodiment of the method of the present invention.

A method for making a semiconductor device is described. That method comprises forming on a substrate a dielectric layer that has a dielectric constant that is greater than the dielectric constant of silicon dioxide. That dielectric layer is modified so that it will be compatible with a gate electrode to be formed on it. A gate electrode is then formed on the dielectric layer. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

In an embodiment of the method of the present invention, as illustrated by FIGS. 1a–1d, dielectric layer 101 is formed on substrate 100. Substrate 100 may include isolation regions, p-type wells and n-type wells that have been formed in a bulk silicon or silicon-on-insulator substructure. Substrate 100 may comprise other materials—which may or may not be combined with silicon—such as: germanium, indium antimonide, lead telluride, indium arsenide, indium phosphide, gallium arsenide, or gallium antimonide. Although several examples of materials from which substrate 100 may be formed are described here, any material that may serve as a foundation upon which a semiconductor device may be built falls within the spirit and scope of the present invention.

Dielectric layer 101 comprises a material that has a dielectric constant that is greater than the dielectric constant of silicon dioxide. Dielectric layer 101 preferably has a dielectric constant that is at least about twice that of silicon dioxide, i.e., a dielectric constant that is greater than about 8. When serving as the gate dielectric for the semiconductor device, dielectric layer 101 is a "high-k gate dielectric." Some of the materials that may be used to make high-k gate dielectrics include: hafnium oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, titanium oxide, and aluminum oxide. Although a few examples of materials that may be used to form dielectric layer 101 are described here, that layer may be made from other materials that serve to reduce gate leakage from the level present in devices that include silicon dioxide gate dielectrics.

Dielectric layer 101 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and dielectric layer 101. The CVD reactor should be operated long enough to form a layer with the desired thickness. In most applications, dielectric layer 101 should be less than about 100 angstroms thick, and more preferably between about 20 angstroms and about 60 angstroms thick.

Figure 1B:
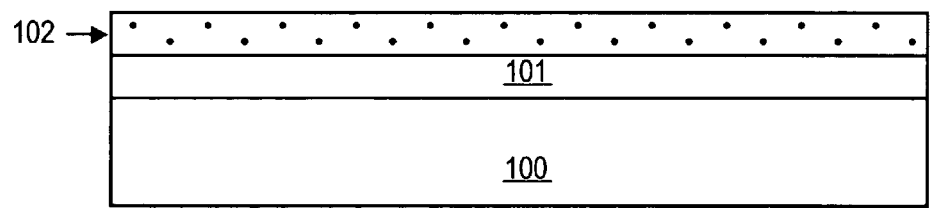
Figure 1C:
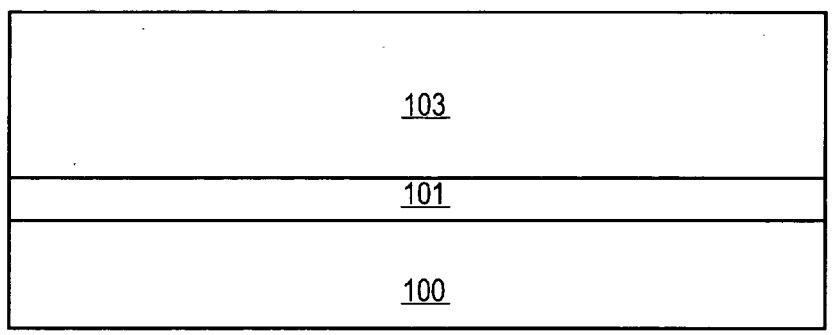
Figure 1D:
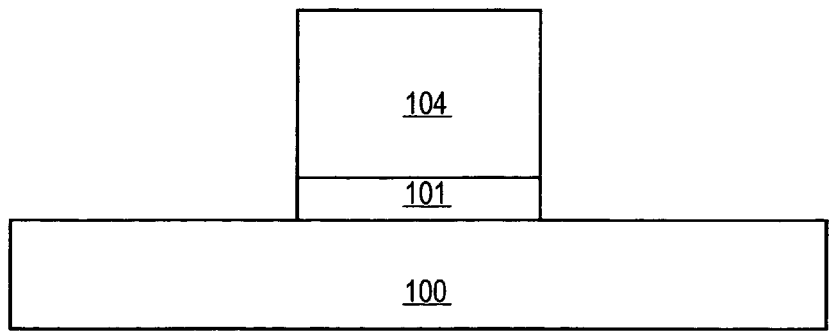

As deposited, dielectric layer 101 will include undesirable impurities, e.g., hydrogen and/or unreacted metal (represented by dots in FIG. 1a), which render that layer incompatible with polysilicon. In the method of the present invention, dielectric layer 101 is modified so that it will be compatible with a gate electrode to be formed on it. FIGS. 1a–1c illustrate steps that may be applied to modify dielectric layer 101. First, sacrificial layer 102 is formed on dielectric layer 101 to generate the structure represented by FIG. 1a. Sacrificial layer 102 preferably is made from a material that may getter impurities from dielectric layer 101. An example of a suitable material is titanium nitride. Such a titanium nitride layer may be formed on dielectric layer 101 using a conventional CVD or PVD process. In a preferred embodiment, such a process is used to form a titanium nitride layer that is between about 10 angstroms and about 50 angstroms thick.

After sacrificial layer 102 is formed on dielectric layer 101, undesirable impurities are transported from dielectric layer 101 to sacrificial layer 102. When sacrificial layer 102 is made from titanium nitride and dielectric layer 101 comprises a high-k gate dielectric layer, impurities may be transported from high-k gate dielectric layer 101 to titanium nitride layer 102 by annealing titanium nitride layer 102. Titanium nitride layer 102 may be annealed using a rapid thermal anneal process or by heating that layer in a furnace at between about 500° C. and about 1,000° C. for between about 5 minutes and about 20 minutes.

FIG. 1b represents a structure in which undesirable impurities, e.g., hydrogen and unreacted metal (represented by dots in FIG. 1b), have been transferred from high-k dielectric layer 101 into titanium nitride layer 102. FIG. 1b is not meant to suggest that annealing titanium nitride layer 102 will cause all undesirable impurities, initially present in high-k dielectric layer 101, to be moved into layer 102. Rather, the annealing step is performed to cause a sufficient number of those impurities to move from high-k dielectric layer 101 into titanium nitride layer 102 to modify high-k dielectric layer 101 such that it will be compatible with a gate electrode to be formed on that layer. Thus, a method that applies an annealing step, which does not remove all—or even substantially all—of the undesirable impurities from high-k dielectric layer 101, may still fall within the spirit and scope of the present invention.

After the undesirable impurities have been transported from dielectric layer 101 to sacrificial layer 102, e.g., by annealing the sacrificial layer, sacrificial layer 102 is removed. When sacrificial layer 102 is made from titanium nitride and dielectric layer 101 comprises a high-k gate dielectric layer, titanium nitride layer 102 may be removed from high-k gate dielectric layer 101 using a conventional wet etch process, which uses a chemistry that is selective for titanium nitride over the material used to form the high-k gate dielectric layer.

Following the removal of sacrificial layer 102, a gate electrode may be formed on dielectric layer 101. In a preferred embodiment, the gate electrode may be formed by initially depositing polysilicon layer 103 on high-k gate dielectric layer 101—generating the FIG. 1c structure. Polysilicon layer 103 may be deposited using conventional methods and preferably is between about 2,000 angstroms and about 4,000 angstroms thick. After etching both layers 103 and 101 to form the FIG. 1d structure, using conventional techniques, additional steps that are generally used to complete the gate electrode (e.g., forming a silicide (not shown) on the upper part of etched polysilicon structure 104) may be applied. As such steps are well known to those skilled in the art, they will not be described in more detail here.

As described above, a sacrificial titanium nitride layer may enable a high-k gate dielectric to be used with a polysilicon-based gate electrode. By forming a titanium nitride layer on a high-k gate dielectric layer, annealing and then removing that layer to remove undesirable impurities from the high-k gate dielectric, the embodiment described above enables the resulting device to benefit from the temporary presence of the titanium nitride layer without experiencing the work function shifts that permanent placement of that layer between the high-k gate dielectric and the gate electrode may cause. Although the embodiment described above is an example of a process for modifying a dielectric layer to enable it to be compatible with a gate electrode, the present invention is not limited to this particular embodiment, but instead contemplates other processes for modifying dielectric layers to ensure compatibility with gate electrodes.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:
   forming a high-k gate dielectric layer on a substrate, the high-k gate dielectric layer including impurities;
   forming a sacrificial layer on the high-k gate dielectric layer;
   removing the impurities from the high-k gate dielectric layer, removing the impurities comprising transporting the impurities from the high-k gate dielectric layer to the sacrificial layer by annealing the sacrificial layer;
   removing the sacrificial lever after removing the impurities; and
   forming a gate electrode on the high-k gate dielectric layer.

2. The method of claim 1 wherein the substrate comprises silicon.

3. The method of claim 1 wherein the high-k gate dielectric layer is formed by atomic layer chemical vapor deposition, and is between about 20 angstroms and about 60 angstroms thick.

4. The method of claim 1 wherein the high-k gate dielectric layer comprises a material selected from the group consisting of hafnium oxide, zirconium oxide, titanium oxide, and aluminum oxide.

5. The method of claim 1 wherein the sacrificial layer is between about 10 angstroms and about 50 angstroms thick.

6. The method of claim 1 wherein removing the impurities comprises annealing the sacrificial layer between about 5 minutes and about 20 minutes.

7. The method of claim 1 wherein removing the sacrificial layer comprises using a wet etch process that is selective for the sacrificial layer over the material used to make the high-k dielectric layer.

8. The method of claim 1 wherein the gate electrode comprises polysilicon.

9. The method of claim 1 wherein the gate electrode is formed directly on the high-k gate dielectric layer.

10. The method of claim 1, wherein the sacrificial layer comprises titanium nitride.

11. The method of claim 1, wherein annealing comprises heating the sacrificial layer at between about 500° C. and about 1,000° C.

* * * * *

UNITED STATES PATENT AND TRADEMARK OFFICE
CERTIFICATE OF CORRECTION

PATENT NO. : 7,166,505 B2  
APPLICATION NO. : 10/943661  
DATED : January 23, 2007  
INVENTOR(S) : Chau et al.

Page 1 of 1

It is certified that error appears in the above-identified patent and that said Letters Patent is hereby corrected as shown below:

Column 1, at line 7, delete "tiled" and insert --filed--.  
Column 4, at line 24, delete "lever" and insert --layer--.

Signed and Sealed this

Twenty-ninth Day of April, 2008

JON W. DUDAS  
*Director of the United States Patent and Trademark Office*